United States Patent
Kawashima et al.

(10) Patent No.: US 8,956,927 B2
(45) Date of Patent: Feb. 17, 2015

(54) METHOD OF MANUFACTURING EPITAXIAL SILICON WAFER AND EPITAXIAL SILICON WAFER MANUFACTURED BY THE METHOD

(71) Applicant: Sumco TechXIV Corporation, Nagasaki (JP)

(72) Inventors: Tadashi Kawashima, Nagasaki (JP); Naoya Nonaka, Nagasaki (JP)

(73) Assignee: Sumco Techxiv Corporation, Nagasaki (JP)

( * ) Notice: Subject to any disclaimer, the term of this patent is extended or adjusted under 35 U.S.C. 154(b) by 0 days.

(21) Appl. No.: 13/916,768

(22) Filed: Jun. 13, 2013

(65) Prior Publication Data

US 2013/0337638 A1 Dec. 19, 2013

(30) Foreign Application Priority Data

Jun. 18, 2012 (JP) ................................. 2012-137178

(51) Int. Cl.
  *H01L 21/00* (2006.01)
  *H01L 21/02* (2006.01)
(52) U.S. Cl.
  CPC ................................ *H01L 21/02532* (2013.01)
  USPC ........................................................ 438/149
(58) Field of Classification Search
  None
  See application file for complete search history.

(56) References Cited

U.S. PATENT DOCUMENTS

| 5,421,288 | A | * | 6/1995 | Ohta et al. | 117/88 |
| 5,487,358 | A | * | 1/1996 | Ohta et al. | 117/200 |
| 6,001,175 | A | * | 12/1999 | Maruyama et al. | 117/102 |
| 7,498,218 | B2 | * | 3/2009 | Ahn | 438/233 |
| 8,101,508 | B2 | | 1/2012 | Kurita et al. | |
| 2009/0205562 | A1 | | 8/2009 | Wada | |
| 2009/0224367 | A1 | | 9/2009 | Kurita et al. | |
| 2010/0213168 | A1 | * | 8/2010 | Haberecht | 216/37 |
| 2010/0272892 | A1 | | 10/2010 | Kobayashi et al. | |

FOREIGN PATENT DOCUMENTS

| JP | 2009-200074 A | 9/2009 |
| JP | 2011-029440 A | 2/2011 |
| JP | 2011-155130 | 8/2011 |
| KR | 10-2009-0095514 A | 9/2009 |

OTHER PUBLICATIONS

U.S. Appl. No. 13/925,267 to Tadashi Kawashima et al., filed Jun. 24, 2013.
Korea Office action, mail date is Oct. 29, 2014.

* cited by examiner

*Primary Examiner* — Charles Garber
*Assistant Examiner* — Andre' C Stevenson
(74) *Attorney, Agent, or Firm* — Greenblum & Bernstein, P.L.C.

(57) ABSTRACT

A method of manufacturing an epitaxial silicon wafer including a silicon wafer having a surface added with phosphorus and an epitaxial film provided on the surface includes adjusting an in-plane thickness distribution of the epitaxial film formed on the surface of the silicon wafer based on an in-plane resistivity distribution of the silicon wafer before an epitaxial growth treatment.

8 Claims, 13 Drawing Sheets

METHOD OF MANUFACTURING EPITAXIAL SILICON WAFER AND EPITAXIAL SILICON WAFER MANUFACTURED BY THE METHOD

The entire disclosure of Japanese Patent Application No. 2012-137178 filed Jun. 18, 2012 is expressly incorporated by reference herein.

BACKGROUND OF THE INVENTION

1. Field of the Invention

The present invention relates to a method of manufacturing an epitaxial silicon wafer and an epitaxial silicon wafer manufactured by the method.

2. Description of Related Art

For instance, for manufacturing an epitaxial silicon wafer used for a power MOS transistor, a substrate resistivity of a silicon wafer needs to be extremely low. As a technique for sufficiently reducing the substrate resistivity of the silicon wafer, there has been known a technique of doping arsenic (As) or antimony (Sb) as an n-type dopant for resistivity adjustment to molten silicone, in a pulling step (i.e., at the time of growing a silicon crystal) of a monocrystalline ingot of a material for a silicon wafer (hereinafter, referred to as a single crystal). However, since such a dopant is extremely volatile, it is difficult to sufficiently increase a dopant concentration in the silicon crystal, so that it is difficult to manufacture a silicon wafer having a resistivity as low as desired.

Accordingly, a silicon wafer having an extremely low substrate resistivity, which is doped with a highly concentrated phosphorus (P) as an n-type dopant having a relatively lower volatility than arsenic (As) or antimony (Sb), has been used.

However, in such an epitaxial silicon wafer, the highly concentrated the dopant contained in the silicon wafer diffuses over an epitaxial film in a heat treatment process in the course of formation of a semiconductor device (a solid layer diffusion phenomenon).

Particularly, when the dopant is phosphorus, since phosphorus has a diffusion speed faster than those of other dopants, a phenomenon of expansion in a transition width (a width of a region at and near an interface between the silicon wafer and the epitaxial film which have different dopant concentrations and in which the dopant concentrations change) notably occurs in the heat treatment process in the course of formation of a semiconductor device.

Since the expansion in the transition width adversely affects essential device-properties such as a breakdown voltage in a semiconductor device, an epitaxial silicon wafer having a narrow transition width and a sharp resistivity distribution between the silicon wafer and the epitaxial film even after the heat treatment process in the course of formation of the semiconductor device has been demanded. To cope with this demand, a study for providing such an epitaxial silicon wafer has been made (see, for instance, Patent Literature 1: JP-A-2011-155130).

Patent Literature 1 discloses that, by setting an oxygen concentration of the silicon wafer at $0.8 \times 10^{18}$ to $1.3 \times 10^{18}$ atoms/cm$^3$, a highly concentrated the dopant contained in the silicon wafer is inhibited from diffusing over the epitaxial film in the heat treatment process in the course of formation of the semiconductor device.

However, it is found that, when a plurality of semiconductor devices are manufactured from a single epitaxial silicon wafer made by the method described in Patent Literature 1, variance in withstand voltages (BVdss) of the semiconductor devices sometimes becomes large. In view of the above, an epitaxial silicon wafer having a small variance in the withstand voltages of the semiconductor devices has been demanded.

SUMMARY OF THE INVENTION

An object of the invention is to provide a method of manufacturing an epitaxial silicon wafer capable of inhibiting variance in withstand voltages of semiconductor devices and an epitaxial silicon wafer manufactured by the method.

As a result of an intense research, the inventors have found that variance in withstand voltages of semiconductor devices heavily depends on an in-plane resistivity distribution of a silicon wafer to be used. Specifically, in a heat treatment process in the course of formation of a semiconductor device, when phosphorus contained in the silicon wafer at a high concentration is diffused over an epitaxial film at an amount uneven in a plane of the silicon wafer, variance in the withstand voltages of the semiconductor devices occurs.

Typically, in pulling a monocrystalline ingot by CZ (Czochralski) method, a temperature distribution of the monocrystalline ingot in a radial direction exhibits a temperature gradient in which a temperature at the center is high and a temperature on an outer periphery is low. Accordingly, it is difficult to constantly and stably grow a monocrystalline ingot having an even resistivity distribution in the radial direction by adjusting CZ pulling conditions.

For instance, FIG. 1 shows results of an in-plane resistivity distribution of a silicon wafer cut out from a monocrystalline ingot manufactured under the following conditions by the CZ method not applying a magnetic field to a silicon molten liquid in a crucible.

Experimental Conditions
  Polarity: n-type
  Dopant: red phosphorus
  Substrate Resistivity: 1.1 mΩ·cm to 1.3 mΩ·cm
  Dopant Concentration: $4.79 \times 10^{19}$ atoms/cm$^3$ to $6.63 \times 10^{19}$ atoms/cm$^3$
  Diameter; 200 mm As obvious from FIG. 1, in the monocrystalline ingot growth step, when using the CZ method not applying a magnetic field to a silicon molten liquid in a crucible, the dopant concentration at the center tends to be higher than the dopant concentration on the outer periphery. On the other hand, it is observed that the dopant concentration at the center tends to be lower than the dopant concentration on the outer periphery when using the MCZ (Magnetic field applied CZ) method applying a magnetic field to a silicon molten liquid in a crucible, though a reason for this tendency is not certain.

An in-plane thickness distribution of the epitaxial film formed on a surface of the silicon wafer also differs depending on usage. However, typically, the in-plane thickness distribution of the epitaxial film is adjusted depending on a surface profile of a wafer to be used, or an epitaxial film is formed so that the epitaxial film thickness distribution becomes even in a plane thereof.

However, it is obviously shown that, when an epitaxial film having an even in-plane thickness distribution is formed on the surface of the silicon wafer having a resistivity at the center lower than a resistivity on the outer periphery as shown in FIG. 1, and the formed epitaxial silicon wafer is subjected to a heat treatment process in the course of formation of a semiconductor device, a resistivity at the center of the epitaxial film becomes lower than a resistivity on the outer periphery thereof, thereby deteriorating a withstand voltage of a semiconductor device at the center of the epitaxial silicon wafer.

In contrast, it is obviously shown that, when an epitaxial film is formed on the surface of the silicon wafer having a resistivity at the center higher than a resistivity on the outer periphery, a resistivity at the center of the epitaxial film becomes higher than a resistivity on the outer periphery thereof, thereby deteriorating a withstand voltage of a semiconductor device on the outer periphery of the wafer.

The inventors considered it effective to provide an epitaxial silicon wafer having an even in-plane resistivity distribution of an epitaxial film after the heat treatment process in the course of formation of the semiconductor device and studied optimization of epitaxial growth conditions. Then, the inventors has found that, by controlling a film thickness distribution of the epitaxial film depending on the in-plane resistivity distribution of the silicon wafer, the in-plane resistivity distribution of the epitaxial film can be made even in the heat treatment process in the course of formation of the semiconductor device, whereby variance in withstand voltages of semiconductor devices can be dissolved.

Specifically, firstly, a 70-second heat treatment (prebake) was conducted in a hydrogen gas atmosphere at 1100 degrees C. to a silicon wafer having a resistivity distribution shown in FIG. 1 using a sheet-type epitaxial equipment. Subsequent to the prebake, the epitaxial film was formed under the following growth conditions:

Material source gas: trichlorosilane ($SiHCl_3$) gas; and
Growth temperature: 1100 degrees C.

At this time, gas flow fed into a crucible in a radial direction of the silicon wafer was controlled to form epitaxial films having film thickness distributions shown in FIGS. 2 to 4.

Specifically, the epitaxial film having the same thickness over an entirety in the radial direction in Experiment 1, the epitaxial film having the center thicker than the outer periphery in Experiment 2, and the epitaxial film having the outer periphery thicker than the center in Experiment 3 were formed. The film thickness distributions of the epitaxial films of Experiments 1 to 3 satisfy a generally tolerance of ±0.05 μm relative to a reference thickness Te (μm).

Then, under the same conditions (a 2-hour heat treatment in an atmosphere of 100% dry oxygen at 1050 degrees C.) as those at the heat treatment in the course of formation of the semiconductor device, the epitaxial silicon wafers having the respective epitaxial films of Experiments 1 to 3 were subjected to a simulated heat treatment. A diffusion amount of phosphorus in each of the epitaxial films was evaluated.

Herein, the diffusion amount refers to an amount corresponding to the transition width and an index calculated by the following method.

Firstly, using FTIR (Fourier Transform Infrared) method, a thickness of a part of the epitaxial silicon wafer in which a concentration of red phosphorus was higher than that in the epitaxial film and lower than that in the silicon wafer (a low-concentration part film thickness) was measured.

When such a measurement method is used, in the epitaxial silicon wafer before the simulated heat treatment, a film thickness of the low concentration part is substantially equal to the film thickness of the epitaxial film, since irradiated infrared ray is transmitted through the epitaxial film and reflected at and near the interface between the epitaxial film and the silicon wafer.

On the other hand, in the epitaxial silicon wafer after the simulated heat treatment, since red phosphorus is diffused from the silicon wafer into the epitaxial film by the heat treatment, irradiated infrared ray is reflected on a further inside of the epitaxial film as compared with in the epitaxial silicon wafer before the simulated heat treatment. Accordingly, as shown in FIG. 5, the film thickness of the low concentration part became thinner than that before the simulated heat treatment.

A difference between the film thickness of the low concentration part before the simulated heat treatment and the film thickness of the low concentration part after the simulated heat treatment is defined as a diffusion amount.

A value of the diffusion amount became large when an amount of red phosphorus diffused into the epitaxial film and the transition width were large. The value of the diffusion amount became small when the amount of red phosphorus diffused into the epitaxial film and the transition width were small. In view of this, it is considered that variance in withstand voltages between semiconductor devices manufactured from the epitaxial silicon wafer becomes small when variance in diffusion amounts in the epitaxial silicon wafer is small.

FIGS. 6 to 8 respectively show distributions of diffusion amounts in the epitaxial silicon wafers in Experiments 1 to 3.

As shown in FIG. 6, in Experiment 1 using the epitaxial film having an even film thickness, it was found that the diffusion amount at the center of the epitaxial film was larger than that on the outer periphery thereof and variance in the diffusion amounts was large. As shown in FIG. 7, in Experiment 2 using the epitaxial film having a film thickness at the center thicker than that on the outer periphery, it was found that the diffusion amount at the center of the epitaxial film was substantially the same as that on the outer periphery thereof and variance in the diffusion amounts was small. As shown in FIG. 8, in Experiment 3 using the epitaxial film having a film thickness on the outer periphery thicker than that at the center, it was found that the diffusion amount at the center of the epitaxial film was more likely to be larger than that on the outer periphery thereof and variance in the diffusion amounts became larger as compared with Experiment 1.

A plurality of semiconductor devices were manufactured from the epitaxial silicon wafers in Experiments 1 to 3 and a withstand voltage of each of the semiconductor devices was evaluated. The evaluation results are shown in FIGS. 9 to 11.

As shown in FIG. 9, in Experiment 1 using the epitaxial film having the even film thickness, it was found that a withstand voltage of a semiconductor device obtained from the center of the epitaxial silicon wafer was smaller than a withstand voltage of a semiconductor device obtained from the outer periphery of the epitaxial silicon wafer, and variance in the withstand voltages was large. As shown in FIG. 10, in Experiment 2 using the epitaxial film having the film thickness at the center thicker than that on the outer periphery, it was found that withstand voltages of the semiconductor devices were substantially constant irrespective of positions at which the semiconductor devices were obtained, and variance in the withstand voltages was small. As shown in FIG. 11, in Experiment 3 using the epitaxial film having a film thickness on the outer periphery thicker than that at the center, it was found that a withstand voltage of the semiconductor device obtained from the center of the epitaxial film was more likely to be smaller than a withstand voltage of the semiconductor device obtained from the outer periphery thereof, and variance in the withstand voltages became larger as compared with Experiment 1.

In view of the above, it was found that the film thickness at the center of the epitaxial film only needs to be thicker than the film thickness on the outer periphery thereof in order to manufacture a semiconductor device having a small variance in withstand voltages.

The invention has been completed based on the aforementioned finding.

According to an aspect of the invention, a method of manufacturing an epitaxial silicon wafer including a silicon wafer added with phosphorus and an epitaxial film provided on a surface of the silicon wafer includes adjusting an in-plane thickness distribution of the epitaxial film formed on the surface of the silicon wafer based on an in-plane resistivity distribution of the silicon wafer before an epitaxial growth treatment.

According to the above aspect of the invention, the epitaxial silicon wafer capable of inhibiting variance in withstand voltages of semiconductor devices can be manufactured by adjusting the in-plane thickness distribution of the epitaxial film based on the in-plane resistivity distribution of the silicon wafer before the epitaxial growth treatment.

In the method of manufacturing the epitaxial wafer according to the above aspect of the invention, the silicon wafer added with the phosphorus preferably has a resistivity of 0.9 mΩ·cm or less. When phosphorus is added to the silicon wafer so that the resistivity of phosphorus becomes less than 0.6 mΩ·cm, the monocrystalline ingot cannot be grown. Accordingly, the resistivity of phosphorus is preferably 0.6 mΩ·cm or more.

According to the above aspect of the invention, the epitaxial silicon wafer capable of manufacturing the semiconductor device having a resistivity according to customers' needs can be provided.

It is preferable that the method of manufacturing the epitaxial wafer according to the above aspect of the invention further includes, on the silicon wafer having a resistivity at a center lower than a resistivity on an outer periphery, forming the epitaxial film to have a film thickness at the center thicker of the silicon wafer than a film thickness on the outer periphery of the silicon wafer.

According to the above aspect of the invention, the epitaxial silicon wafer capable of inhibiting variance in withstand voltages of semiconductor devices can be manufactured by making the film thickness of the epitaxial film at the center of the silicon wafer thicker than the film thickness of the epitaxial film on the outer periphery of the silicon wafer.

It is preferable that the method of manufacturing the epitaxial wafer according to the above aspect of the invention further includes, when flowing a reaction gas for forming the epitaxial film along the surface of the silicon wafer, in the forming of the epitaxial film, controlling a flow amount of the reaction gas at the center of the silicon wafer to be larger than a flow amount of the reaction gas on the outer periphery of the silicon wafer.

It is preferable that the method of manufacturing the epitaxial wafer according to the above aspect of the invention further includes, when heating the silicon wafer, in the forming of the epitaxial film, controlling a temperature at the center of the silicon wafer to be higher than a temperature on the outer periphery of the silicon wafer.

According to the above aspect of the invention, the film thickness of the epitaxial film is controllable only by a simple method of controlling a flow amount of a reaction gas and heating conditions of the silicon wafer and the epitaxial silicon wafer capable of inhibiting variance in withstand voltages of semiconductor devices can be manufactured.

It is preferable that the method of manufacturing the epitaxial wafer according to the above aspect of the invention further includes, on the silicon wafer having a resistivity at a center higher than a resistivity on an outer periphery, forming the epitaxial film to have a film thickness at the center of the silicon wafer thinner than a film thickness on the outer periphery of the silicon wafer.

It is preferable that the method of manufacturing the epitaxial wafer according to the above aspect of the invention further includes, when flowing a reaction gas for forming the epitaxial film along the surface of the silicon wafer, in the forming of the epitaxial film, controlling a flow amount of the reaction gas at the center of the silicon wafer to be smaller than a flow amount of the reaction gas on the outer periphery of the silicon wafer.

It is preferable that the method of manufacturing the epitaxial wafer according to the above aspect of the invention further includes, when heating the silicon wafer, in the forming of the epitaxial film, controlling a temperature at the center of the silicon wafer to be lower than a temperature on the outer periphery of the silicon wafer.

According to the above aspect of the invention, the epitaxial silicon wafer capable of inhibiting variance in withstand voltages of semiconductor devices can be manufactured by making the film thickness of the epitaxial film at the center of the silicon wafer thinner than the film thickness of the epitaxial film on the outer periphery of the silicon wafer.

Moreover, the film thickness of the epitaxial film is controllable only by a simple method of controlling a flow amount of a reaction gas and heating conditions of the silicon wafer and the epitaxial silicon wafer capable of inhibiting variance in withstand voltages of semiconductor devices can be manufactured.

An epitaxial silicon wafer according to another aspect of the invention is manufactured by the method of manufacturing the epitaxial silicon wafer according to the above aspect of the invention.

DESCRIPTION OF EMBODIMENT(S)

An exemplary embodiment of the invention will be described below with reference to the attached drawings.

Arrangement of Epitaxial Equipment

Firstly, an arrangement of an epitaxial equipment will be described.

Figure 12:
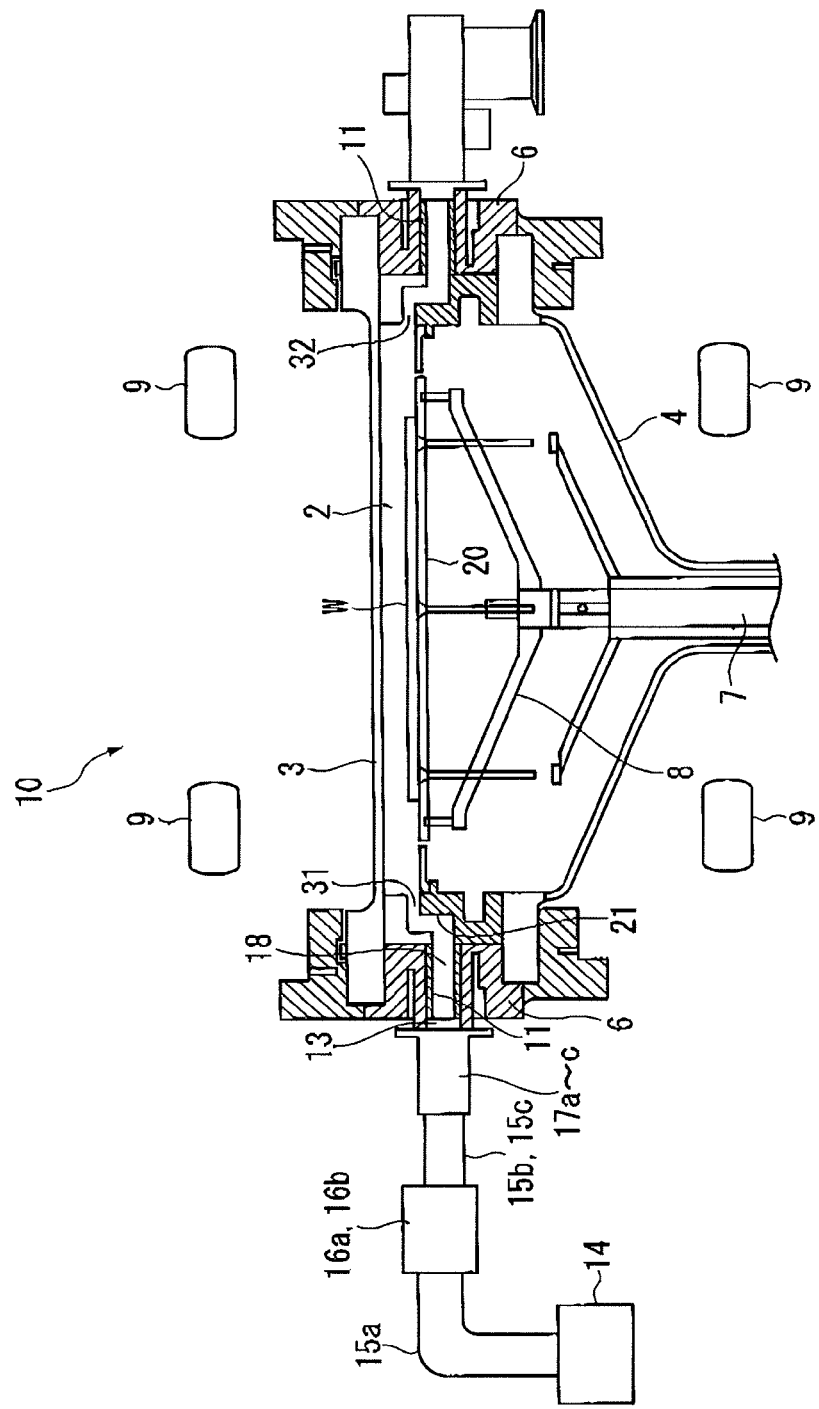
FIG. 12 is a cross-sectional view schematically showing an epitaxial equipment according to an exemplary embodiment of the invention.

As shown in FIG. 12, an epitaxial equipment 10 includes: a circular upper dome 3 having a concave surface; and a circular lower dome 4. The upper dome 3 and the lower dome 4 are formed of a transparent material such as quartz. The upper dome 3 and the lower dome 4 are vertically disposed to face each other. Peripheral ends of the upper dome 3 and the lower dome 4 are respectively fixed to upper and lower surfaces of an annular dome mount 6. With this arrangement, a sealed reaction chamber 2 substantially circular in a plan view is formed. Above and below the reaction chamber 2, a plurality of halogen lamps 9 for heating an inside of the reaction chamber 2 are spaced apart from each other at substantially equal intervals in a circumferential direction.

In the reaction chamber 2, a susceptor 20 for mounting a silicon wafer W is disposed. The susceptor 20 is provided by coating a SiC film over a surface of a carbon material so that the susceptor 20 can be resistant at high temperatures in the reaction chamber 2. The susceptor 20 is shaped in a disk having a predetermined thickness. A radius of the susceptor 20 is larger than that of the silicon wafer W to be mounted on the susceptor 20.

A susceptor-supporter 8 for supporting the susceptor 20 is provided on a rear (lower) surface of the susceptor 20. A shaft 7 is fixed to a bottom of the susceptor-supporter 8. The shaft 7 is rotatable by a driving mechanism (not shown). Consequently, the cylindrical susceptor-supporter 8 and the susceptor 20 are also rotatable at a predetermined speed in a horizontal plane.

A gas supply port 31 through which gas flows into the reaction chamber 2 is provided at a predetermined position on the dome mount 6 of the reaction chamber 2. At an opposite position on the dome mount 6 (a position separated from the gas supply port 31 by 180 degrees), a gas discharge port 32 through which gas in the reaction chamber 2 is discharged is provided. Reaction gas is generated by the following gas supply section and is supplied to the reaction chamber 2 through the gas supply port 31.

Figure 13:
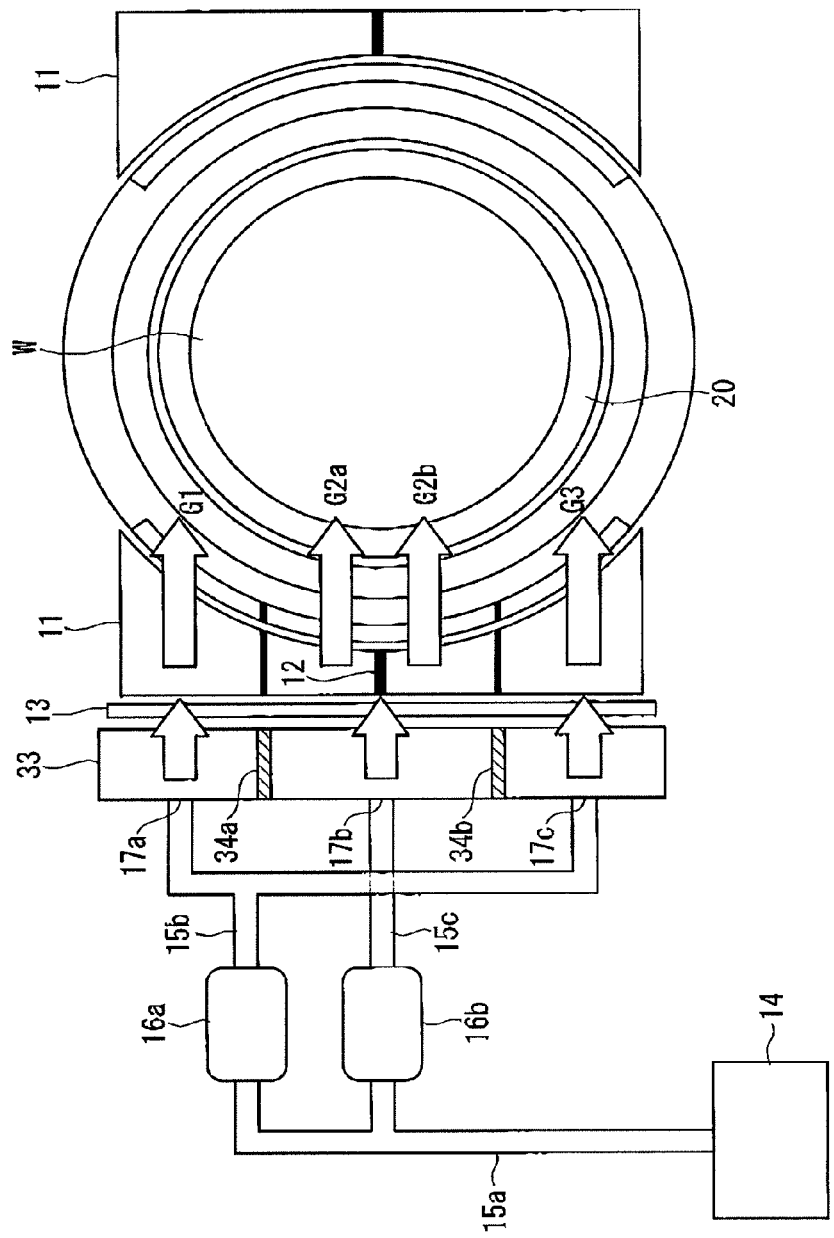
FIG. 13 is a plan view schematically showing the epitaxial equipment.

Next, the gas supply section will be described in detail also with reference to FIG. 13.

In the gas supply section, a gas supply source 14 that generates a reaction gas is disposed. A gas pipe 15a that feeds the generated reaction gas into the reaction chamber 2 is provided. The gas pipe 15a is divided into gas pipes 15b and 15c respectively leading to a periphery and a center of the silicon wafer W. The two gas pipes 15b and 15c respectively includes gas valves 16a and 16b that regulate a gas amount from the gas supply source 14. The gas pipe 15b obtained by dividing the gas pipe 15a is further divided into two. Three gas feed ports 17a to 17c that discharge the reaction gases G1, G2a, G2b and G3 are formed in a substantially horizontally juxtaposed manner.

An injection cap 33 is substantially horizontally provided to face the gas feed ports 17a to 17c. The injection cap 33 has a gas flow path defined by an upper plate, a lower plate and a pair of side plates. The gas flow path is divided into three by partitions 34a and 34b that are jointed to the upper plate and the lower plate.

Further, a baffle 13 is substantially horizontally provided to face the injection cap 33. The baffle 13 has a plurality of gas introducing holes (not shown) on a surface opposing the gas feed ports 17a to 17c.

A gas flow rectifier 11 is provided adjacent to the baffle 13. The gas flow rectifier 11 includes: a horizontal upper plate having a predetermined width and a predetermined length in a gas flow direction; a lower plate positioned below the upper plate at a predetermined interval from the upper plate; and a pair of side plates that joint widthwise ends of the upper plate and the lower plate to each other. At a widthwise center of the upper plate, a partition 12 that joints the upper plate to the lower plate is provided. A gas flow path 18 is defined as an inside surrounded by the upper plate, the lower plate, the partition 12 and the pair of side plates.

The gas flow path 18 of the gas flow rectifier 11 has a step (not shown) having a predetermined gap in height and communicates with the gas supply port 31 of the reaction chamber 2. The reaction gases G1, G2a, G2b and G3 are supplied into the reaction chamber 2 through the gas flow rectifier 11.

Manufacturing Method of Epitaxial Silicon Wafer

Next, a manufacturing method of an epitaxial silicon wafer using the epitaxial equipment 10 will be described.

Firstly, a silicon wafer W (one-side polished wafer) having a diameter of 200 mm and a resistivity of 1.1 mΩ·cm to 1.3 mΩ·m is prepared. A resistivity of the silicon wafer W is adjusted by adding n-type red phosphorus. The silicon wafer W has a resistivity distribution in which a resistivity at the center is lower than a resistivity on the outer periphery as shown in, for instance, FIG. 1.

Next, the silicon wafer W with a polished surface facing upward is mounted on a surface of the susceptor 20 by a transfer mechanism (not shown) in the reaction chamber 2. Subsequently, the reaction chamber 2 is sealed. Then, the shaft 7 of the susceptor-supporter 8 is rotated at a predetermined speed, thereby rotating the silicon wafer W mounted on the susceptor 20.

Next, a prebake step is conducted to remove natural oxide films or particles adhered on the surface of the silicon wafer W. The prebake step includes: supplying only hydrogen gas into the reaction chamber 2 by the gas supply source 14; heating the silicon wafer W by the halogen lamps 9 to 1100 degrees C.; and keeping the heated silicon wafer W at 1100 degrees C. for 70 seconds.

Next, a step for growing an epitaxial film is conducted (an epitaxial film growth step). In the gas supply source 14, trichlorosilane ($SiHCl_3$) gas and phosphine ($PH_3$) (both are material source gas) are diluted and mixed with hydrogen gas to generate a reaction gas. Then, the reaction gas is fed into the gas pipe 15a.

Next, the reaction gases G1, G2a, G2b and G3 are discharged from the gas feed ports 17a to 17c via the gas valves 16a and 16b provided to the gas pipes 15b and 15c.

At this time, by adjusting the gas valves 16a and 16b, flow amounts of the reaction gases G2a and G2 discharged toward the center of the silicon wafer W are set to be more than flow amounts of the reaction gases G1 and G3 discharged toward the periphery of the silicon wafer (a reaction gas control step).

Subsequently, the reaction gases G1, G2a, G2b and G3 discharged from the gas feed ports 17a to 17c are fed into the gas flow path 18 of the gas flow rectifier 11, pass over the step and are fed into the reaction chamber 2 through the gas supply port 31.

Simultaneously, the above reaction gases used for reacting with the silicon wafer W in the reaction chamber 2 are discharged from the gas flow rectifier 11 via the gas discharge port 32. The halogen lamps 9 provided above and under the reaction chamber 2 radiate heat to keep the temperature of the silicon wafer W at 1100 degrees C.

At this time, the susceptor 20 holding the silicon wafer W evenly receives radiation heat from the lower halogen lamps 9 through the susceptor-supporter 8. The gas from the gas supply source 14 is discharged from the gas supply port 31 via the gas flow rectifier 11 and is fed so that the gas flow amount at the center of the silicon wafer W is more than the gas flow amount on the outer periphery thereof.

Figure 3:
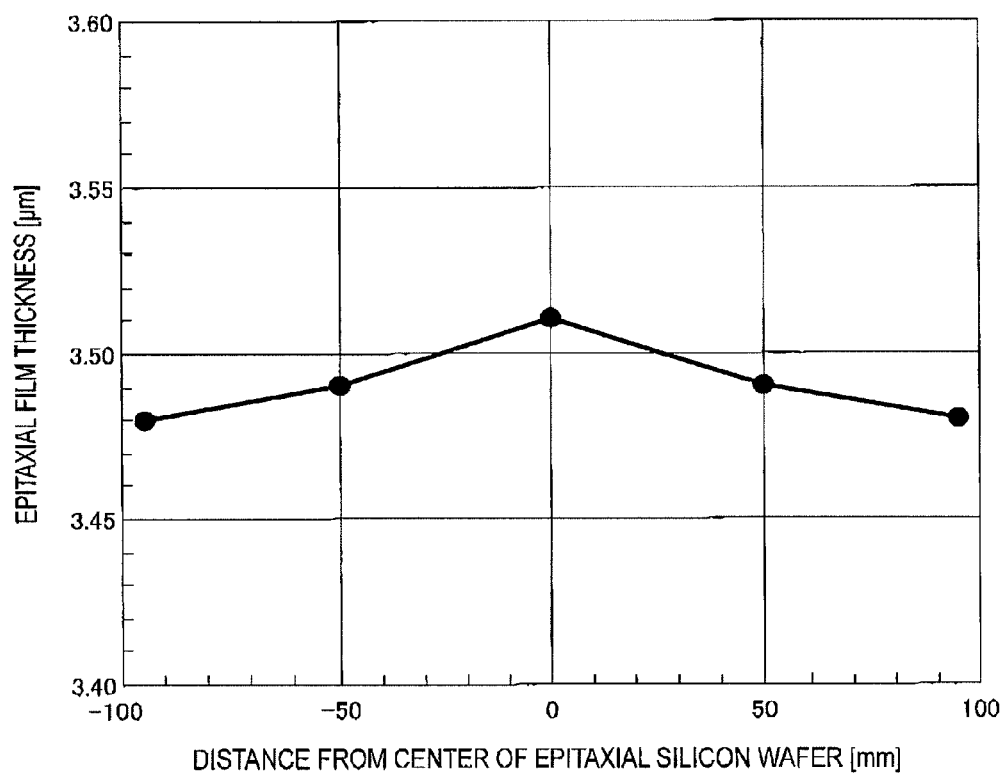
FIG. 3 is a graph showing a film thickness distribution of an epitaxial film in Experiment 2 of the experiments.
Figure 4:
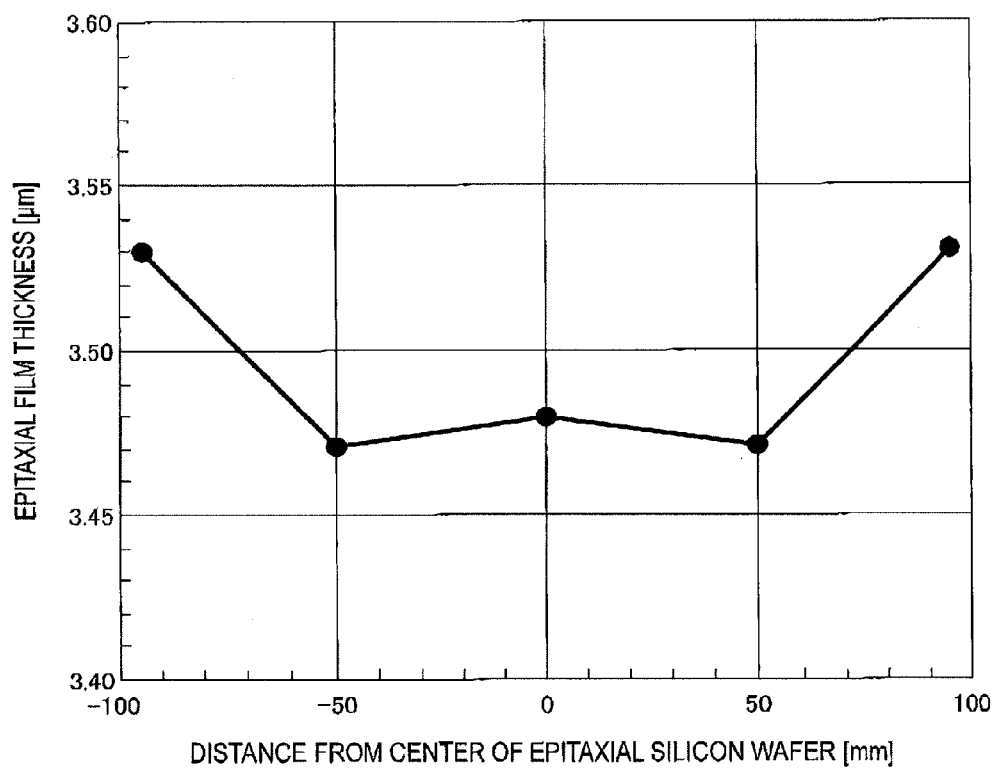
FIG. 4 is a graph showing a film thickness distribution of an epitaxial film in Experiment 3 of the experiments.
Figure 5:
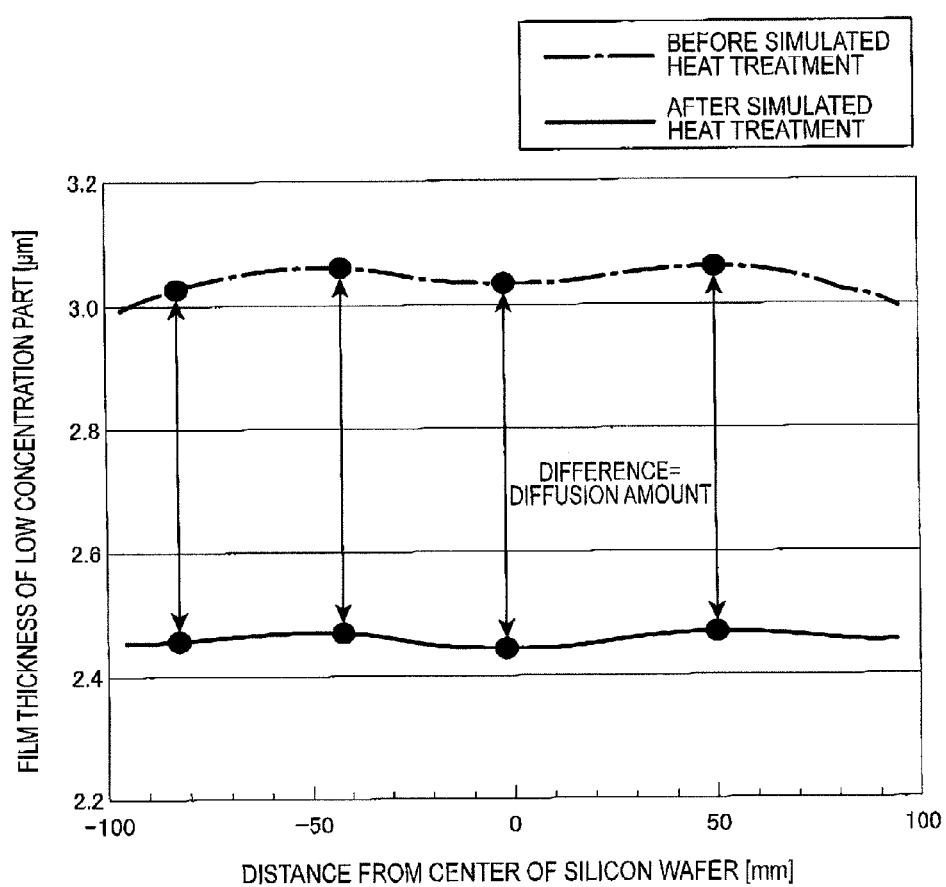
FIG. 5 describes a diffusion amount in the experiments.
Figure 6:
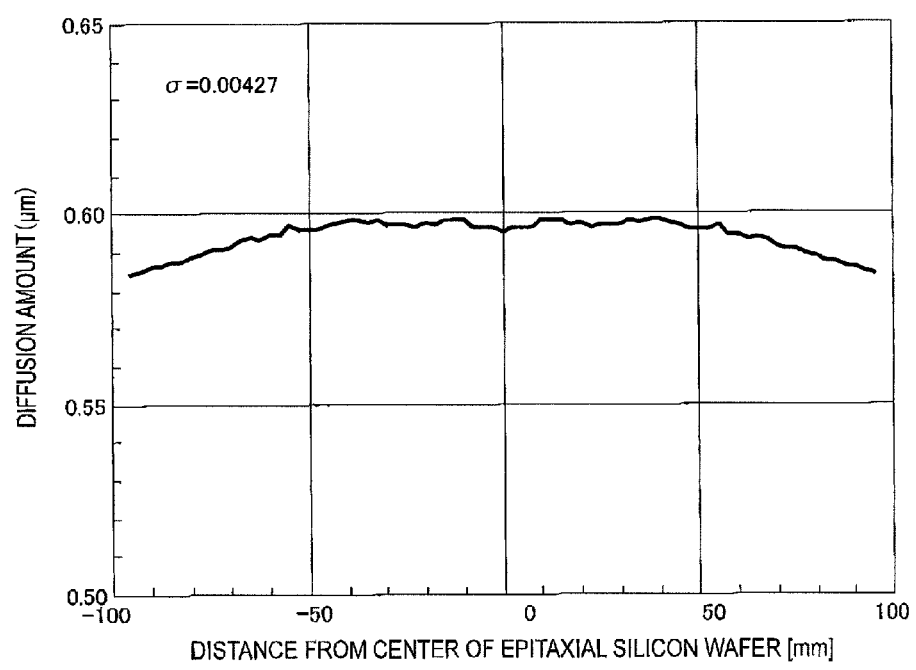
FIG. 6 is a graph showing a distribution of a diffusion amount in the epitaxial silicon wafer in Experiment 1.
Figure 7:
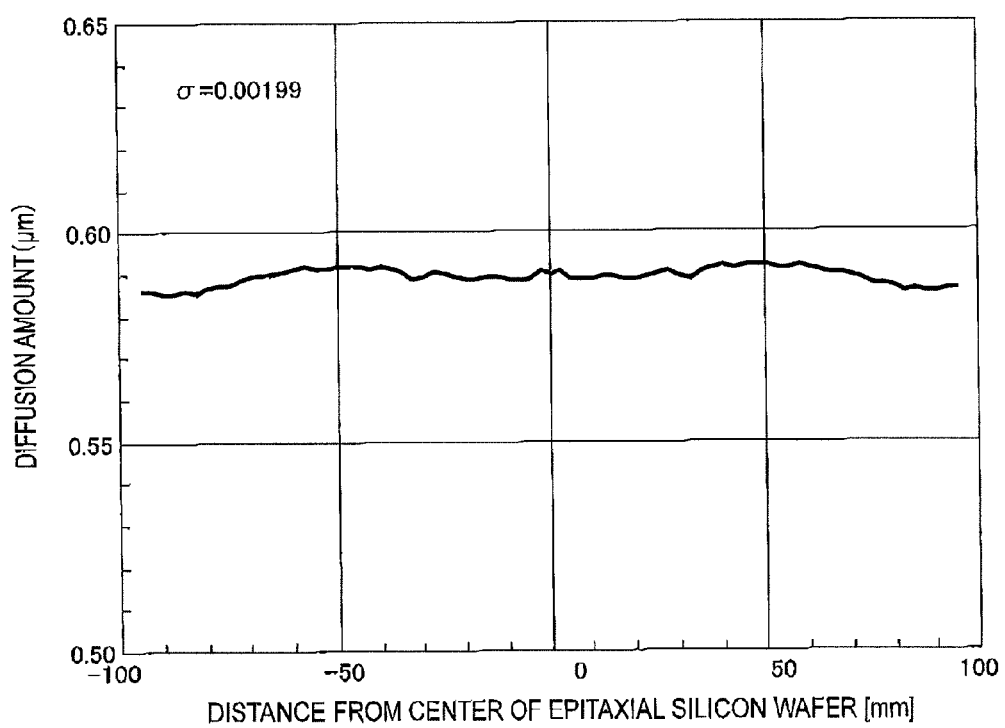
FIG. 7 is a graph showing a distribution of a diffusion amount in the epitaxial silicon wafer in Experiment 2.
Figure 8:
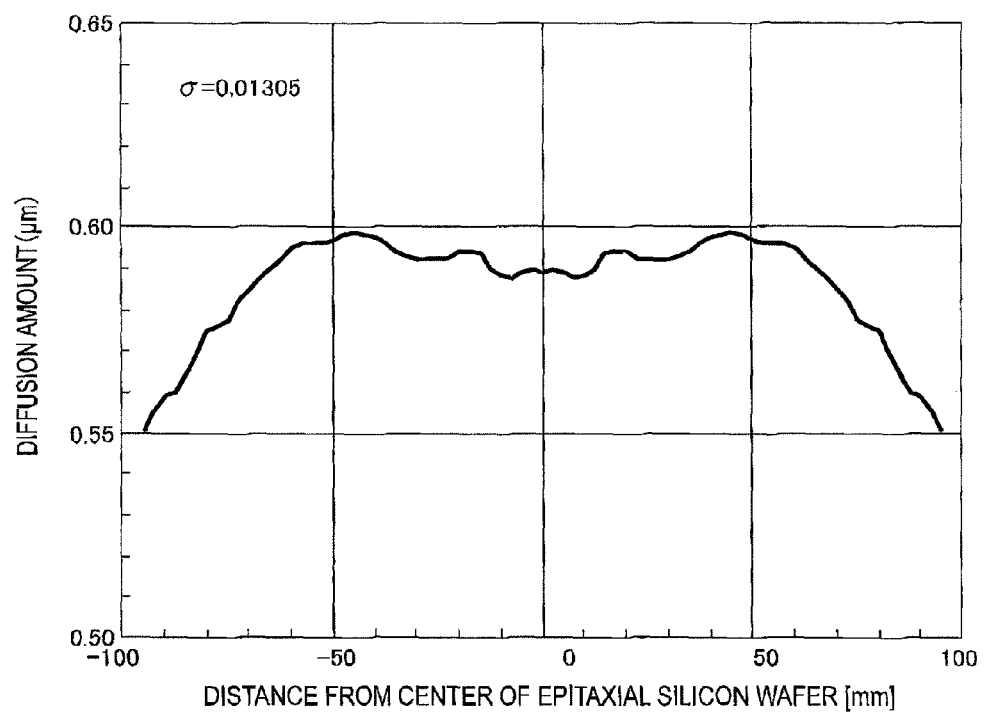
FIG. 8 is a graph showing a distribution of a diffusion amount in the epitaxial silicon wafer in Experiment 3.
Figure 9:
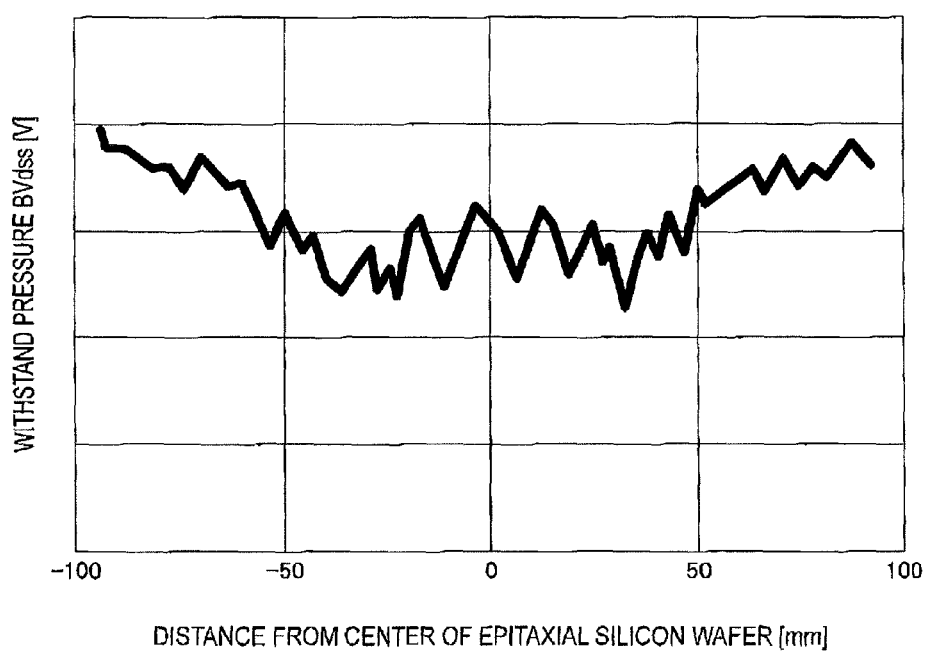
FIG. 9 is a graph showing a distribution of a withstand voltage of a semiconductor device obtained from the epitaxial silicon wafer in Experiment 1.

Such an adjustment of the flow amount of the reaction gas enables manufacturing of an epitaxial silicon wafer having an epitaxial film in which a film thickness at the center is thicker than a film thickness on the outer periphery as shown in, for instance, FIG. 3. In other words, the film thickness of the epitaxial film at the center of the silicon wafer W is formed thicker than the film thickness of the epitaxial film on the outer periphery of the silicon wafer W (an epitaxial film formation step).

Figure 1:
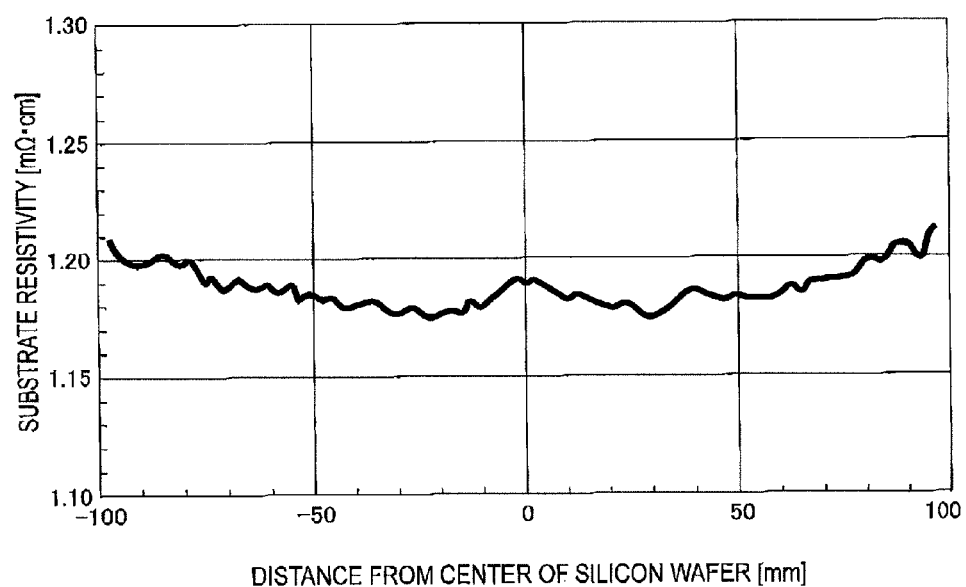
FIG. 1 is a graph showing a resistivity distribution of a silicon wafer as a result of experiments for deriving manufacturing requirements of an epitaxial silicon wafer of the invention.
Figure 2:
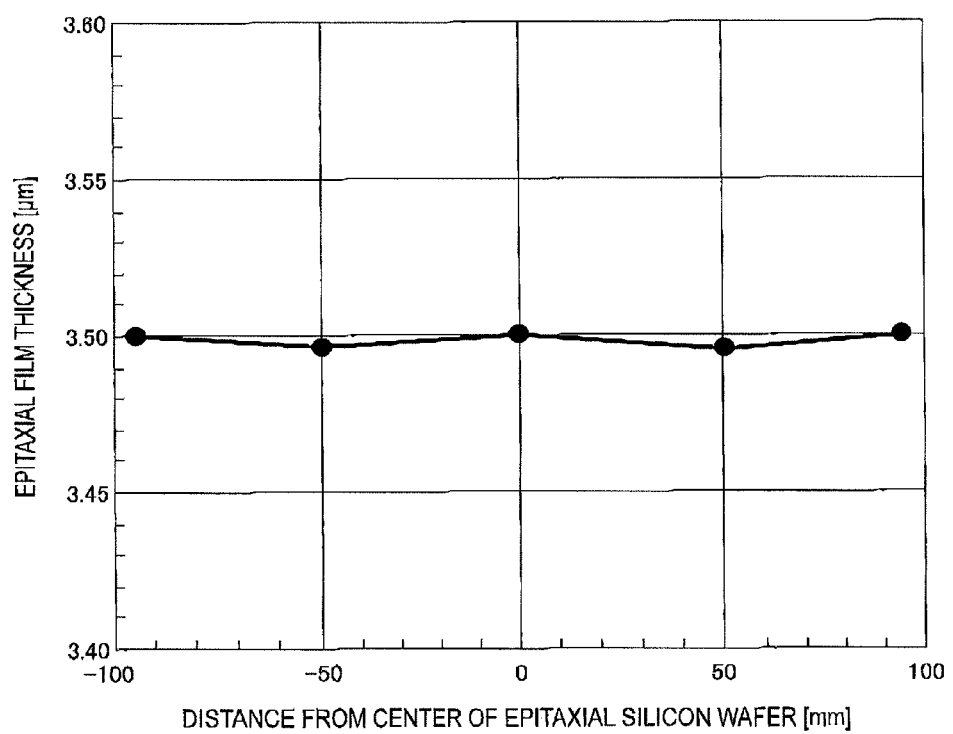
FIG. 2 is a graph showing a film thickness distribution of an epitaxial film in Experiment 1 of the experiments.
Figure 10:
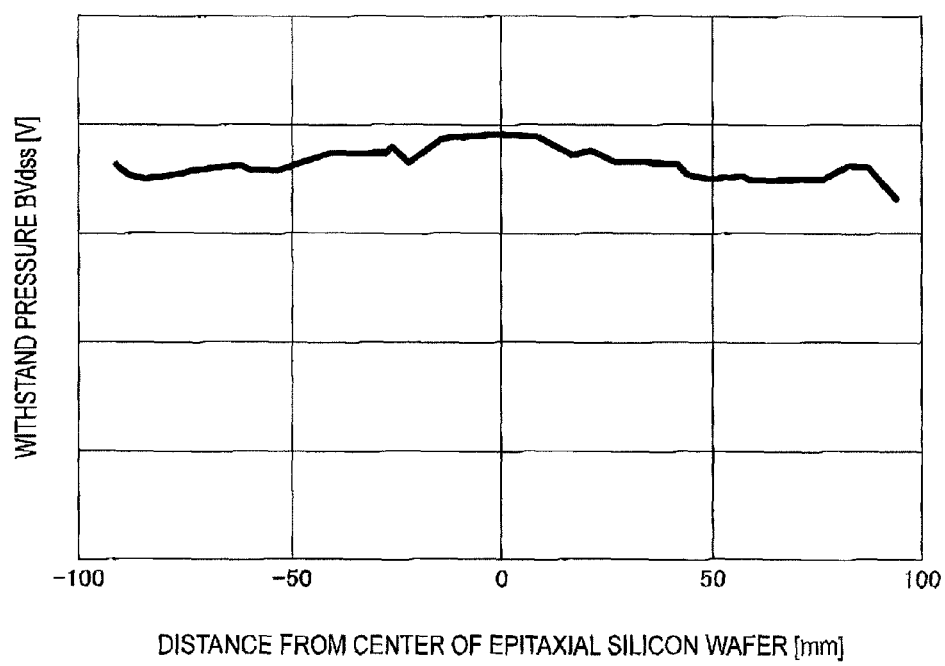
FIG. 10 is a graph showing a distribution of a withstand voltage of a semiconductor device obtained from the epitaxial silicon wafer in Experiment 2.
Figure 11:
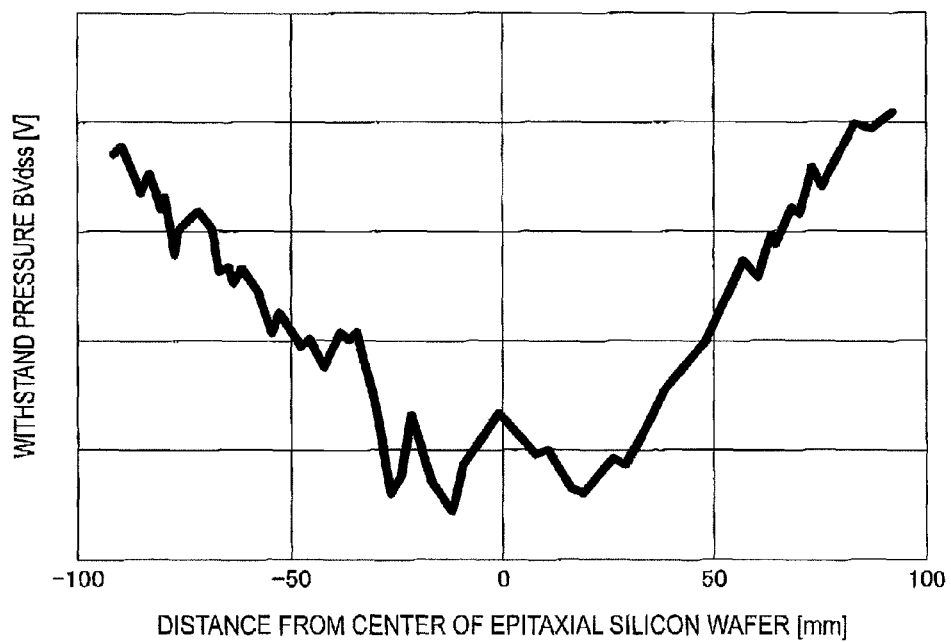
FIG. 11 is a graph showing a distribution of a withstand voltage of a semiconductor device obtained from the epitaxial silicon wafer in Experiment 3.

When a semiconductor device is manufactured with use of the epitaxial silicon wafer manufactured by the above method, even with use of a silicon wafer W having a resistivity distribution in which a resistivity in the center is lower than that of the outer periphery as shown in FIG. 1, variance in withstand voltages of semiconductor devices can be inhibited as shown in FIG. 10.

Other Exemplary Embodiments

Incidentally, the scope of the invention is not limited to the above-mentioned embodiments, but includes a variety of improvements and configuration modifications as far as an inventive concept of the invention is accomplished.

For instance, as a method for controlling the film thickness of the epitaxial film, a heat control step may be conducted in place of the reaction gas control step, in which radiation of the halogen lamps 9 is controlled so that the temperature at the center of the silicon wafer W is higher than that on the outer periphery thereof. Such a heat control step can also enable the film thickness of the epitaxial film at the center of the silicon wafer W to be thicker than the film thickness of the epitaxial film on the outer periphery of the silicon wafer W.

Further, both the reaction gas control step and the heat control step may be conducted, whereby the film thickness of the epitaxial film at the center of the silicon wafer W is made thicker than the film thickness of the epitaxial film on the outer periphery of the silicon wafer W.

Although the silicon wafer W having a resistivity at the center lower than a resistivity on the outer periphery is exemplarily used in the above exemplary embodiment, a silicon wafer W having a resistivity at the center higher than a resistivity on the outer periphery may be used. In this case, contrary to the above exemplary embodiment, variance in withstand voltages of semiconductor devices can be inhibited by forming an epitaxial film to have a film thickness at the center of the silicon wafer W thinner than a film thickness on the outer periphery of the silicon wafer W.

As a method of forming an epitaxial film to have a film thickness at the center thinner than a film thickness on the outer periphery, at least one of (i) the reaction gas control step in which the reaction gas is fed so that the gas flow amount at the center of the silicon wafer W is controlled to be smaller than the gas flow amount on the outer periphery of the silicon wafer W; and (ii) the heat control step in which the temperature at the center of the silicon wafer W is controlled to be lower than that on the outer periphery may be conducted.

Further, various silicon wafers W having different in-plane resistivity (concentration) distributions may be treated as follows.

Specifically, a relationship between a film thickness distribution of an epitaxial film to be formed and a distribution profile of a diffusion amount in the epitaxial film after a predetermined device-simulated-heat treatment is conducted on the formed epitaxial silicon wafer is experimentally obtained in advance to make a master table for every resistivity (concentration) distribution of the silicon wafer W.

Then, after searching for the data matching the in-plane resistivity (concentration) distribution of the silicon wafer W to be actually used in the master table, an epitaxial film thickness distribution may be set so as to eliminate unevenness of the diffusion amount, thereby producing an epitaxial silicon wafer.

The manufacturing method of the invention may be applied for manufacturing an epitaxial silicon wafer using a silicon wafer having a resistivity more than 0.9 mΩ·cm.

What is claimed is:

1. A method of manufacturing an epitaxial silicon wafer comprising a silicon wafer added with phosphorus and an epitaxial film provided on a surface of the silicon wafer, the method comprising:
    adjusting an in-plane thickness distribution of the epitaxial film formed on the surface of the silicon wafer added with phosphorous based on an in-plane resistivity distribution of the silicon wafer of 0.9 mΩ·cm or less, before an epitaxial growth treatment, by controlling a flow amount of reaction gas at a center of the silicon wafer to be different from a flow amount of reaction gas on an outer periphery of the silicon wafer, when flowing a reaction gas for forming the epitaxial film along the surface of the silicon wafer, in the forming of the epitaxial film.

2. The method of manufacturing the epitaxial silicon wafer according to claim 1, further comprising:
    on the silicon wafer having a resistivity at the center lower than a resistivity on the outer periphery, forming the epitaxial film to have a film thickness at the center of the silicon wafer thicker than a film thickness on the outer periphery of the silicon wafer.

3. The method of manufacturing the epitaxial silicon wafer according to claim 2, further comprising:
    when flowing the reaction gas for forming the epitaxial film along the surface of the silicon wafer, in the forming of the epitaxial film, controlling the flow amount of the reaction gas at the center of the silicon wafer to be larger than the flow amount of the reaction gas on the outer periphery of the silicon wafer.

4. The method of manufacturing the epitaxial silicon wafer according to claim 3, further comprising:
    when heating the silicon wafer, in the forming of the epitaxial film, controlling a temperature at the center of the silicon wafer to be higher than a temperature on the outer periphery of the silicon wafer.

5. The method of manufacturing the epitaxial silicon wafer according to claim 1, further comprising:
    on the silicon wafer having a resistivity at the center higher than a resistivity on the outer periphery, forming the epitaxial film to have a film thickness at the center of the silicon wafer thinner than a film thickness on the outer periphery of the silicon wafer.

6. The method of manufacturing the epitaxial silicon wafer according to claim 5, further comprising:
    when flowing the reaction gas for forming the epitaxial film along the surface of the silicon wafer, in the forming of the epitaxial film, controlling the flow amount of the reaction gas at the center of the silicon wafer to be smaller than the flow amount of the reaction gas on the outer periphery of the silicon wafer.

7. The method of manufacturing the epitaxial silicon wafer according to claim 5, further comprising:
    when heating the silicon wafer, in the forming of the epitaxial film, controlling a temperature at the center of the silicon wafer to be lower than a temperature on the outer periphery of the silicon wafer.

8. An epitaxial silicon wafer manufactured by the method of manufacturing the epitaxial silicon wafer according to claim 1.

\* \* \* \* \*